United States Patent [19]

Iwatare et al.

[11] Patent Number: 5,259,784
[45] Date of Patent: Nov. 9, 1993

[54] PRINTED CIRCUIT BOARD ASSEMBLY OF VERTICAL AND HORIZONTAL PRINTED BOARDS

[75] Inventors: Misao Iwatare; Keijirou Kadomatsu, both of Tokyo; Satoru Onodera, Miyagi, all of Japan

[73] Assignee: NEC Corporation, Tokyo, Japan

[21] Appl. No.: 894,097

[22] Filed: Jun. 5, 1992

[30] Foreign Application Priority Data

Jun. 10, 1991 [JP] Japan .............................. 3-43145[U]

[51] Int. Cl.⁵ .............................................. H01R 13/00
[52] U.S. Cl. .................................. 439/377; 361/788; 361/803
[58] Field of Search ....................... 439/377, 629–637; 361/412, 413, 415

[56] References Cited

U.S. PATENT DOCUMENTS

| | | | |
|---|---|---|---|
| 3,017,232 | 1/1962 | Schwab et al. | 439/377 |
| 3,197,731 | 7/1965 | Beale et al. | 439/377 |
| 3,801,873 | 4/1974 | Stumpf et al. | 439/377 |

*Primary Examiner*—Joseph H. McGlynn
*Attorney, Agent, or Firm*—Laff, Whitesel, Conte & Saret

[57] ABSTRACT

In a printed circuit board assembly comprising vertical printed circuit boards, perpendicular printed circuit boards, which are perpendicular to the vertical printed circuit boards, are disposed horizontally. A vertical back-board module is used. A vertical front board is arranged parallel in front of the vertical back-board module and has a front surface and a back surface. A connector group attaches the vertical back-board module to the back surface. With vertical attaching and receiving connectors, the vertical printed circuit boards are attached perpendicularly to the vertical front board. Similarly, the perpendicular printed circuit boards are attached perpendicularly to the back board module with perpendicular attaching and receiving connectors.

13 Claims, 3 Drawing Sheets

PRINTED CIRCUIT BOARD ASSEMBLY OF VERTICAL AND HORIZONTAL PRINTED BOARDS

BACKGROUND OF THE INVENTION

This invention relates to a printed circuit board assembly comprising a plurality of printed circuit boards removably on a back board.

In the manner which will later be described more in detail, a conventional printed circuit board assembly comprises: (A) a plurality of vertical printed circuit boards, each comprising a vertical attaching connector; (B) a plurality of perpendicular printed circuit boards perpendicularly of the vertical printed circuit boards, each perpendicular printed circuit board comprising a perpendicular attaching connector; (C) a shelf board for slidably receiving the vertical and the perpendicular printed circuit boards all perpendicularly of the shelf board; and (D) a vertical back board comprising (D1) a plurality of vertical receiving connectors for removably vertically receiving the vertical attaching connectors of the vertical printed circuit boards and (D2) a plurality of perpendicular receiving connectors for removably perpendicularly receiving the perpendicular attaching connectors of the perpendicular printed boards.

On assembling the conventional printed circuit board assembly, a technician or worker either stands or sits in front of the vertical back board and first places the shelf board in a predetermined position relative to the back board. Next, the technician assembles either the vertical or the perpendicular printed circuit boards to the shelf board and to the back board by using the vertical attaching and receiving connectors and the perpendicular attaching and receiving connectors. It is consequently necessary for the technician to always move aside relative to the back board on attaching the perpendicular printed circuit boards to the shelf board. This makes the technician feel it inconvenient to assemble the conventional printed circuit board assembly.

Once the printed circuit board assembly is assembled, it is not possible for the technician easily to disassemble the printed circuit board assembly. This is because the technician must move aside relative to the back board on removing the perpendicular printed circuit boards from the shelf board.

SUMMARY OF THE INVENTION

It is therefore an object of the present invention to provide a printed circuit board assembly which is conveniently assembled.

It is another object of this invention to provide a printed circuit board assembly which is of the type described and which can be conveniently disassembled.

Other objects of this invention will become clear as the description proceeds.

In accordance with an aspect of this invention, there is provided a printed circuit board assembly comprising: (A) a plurality of vertical printed circuit boards, each comprising a vertical attaching connector; (B) a plurality of perpendicular printed circuit boards, each comprising a perpendicular attaching connector; (C) a vertical back-board module; (D) a vertical front board having a front surface and a back surface parallel in front of the vertical back-board module; (E) a connector group attaching the vertical back-board module to the back surface; (F) a plurality of vertical receiving connectors on the front surface for removably vertically receiving the vertical attaching connectors of the vertical printed circuit boards; and (G) a plurality of horizontal receiving connectors on the vertical back-board module for removably horizontally receiving the perpendicular attaching connectors of the perpendicular printed boards.

According to a different aspect of this invention, there is provided a printed circuit board assembly comprising: (A) a vertical front board having a front surface and a back surface; (B) a vertical back-board module facing the back surface and comprising a plurality of vertical component front boards which are parallel to the back surface and which have stepwise varying lengths, the lengths forming at least a series of stepwise edgings; and (C) a connector group comprising a plurality of stepwise connectors between the back surface and the stepwise edgings.

DESCRIPTION OF THE PREFERRED EMBODIMENT

Figure 1:
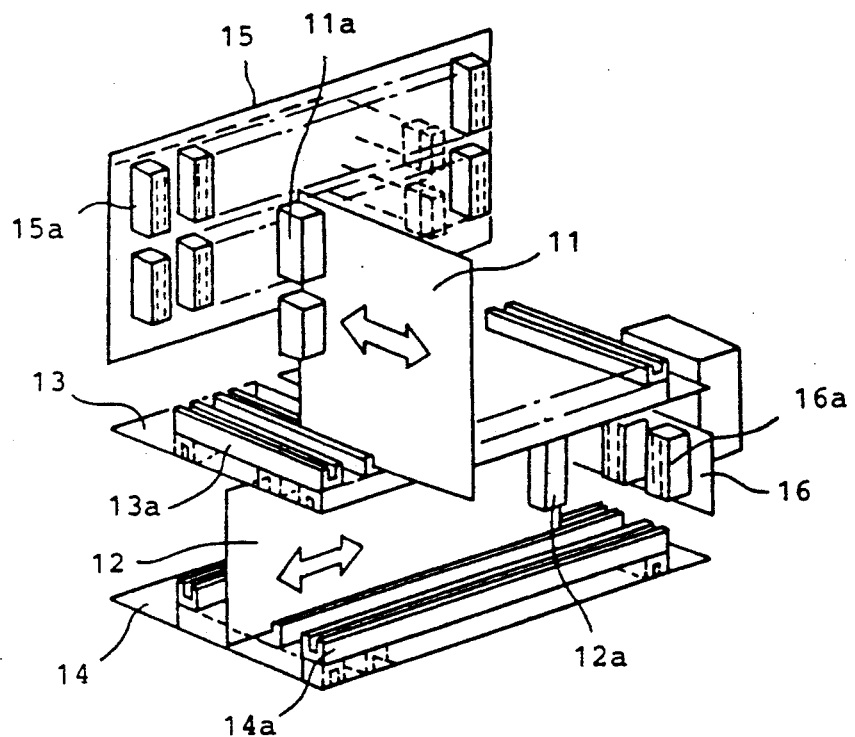
FIG. 1 is a perspective view of a conventional printed circuit board assembly.

Referring to FIG. 1, a conventional printed circuit board assembly will first be described in order to facilitate an understanding of the present invention. The printed circuit board assembly comprises a plurality of vertical printed circuit boards 11, each comprising at least one vertical attaching connector 11a. It should be noted in this connection that only one of the vertical printed circuit board 11 is depicted merely for simplicity of illustration.

A plurality of perpendicular printed circuit boards 12 are used perpendicularly of the vertical printed circuit boards 11. Like the vertical printed circuit boards 11, only one of the perpendicular printed circuit boards 12 is illustrated. Each perpendicular printed circuit board 12 comprises a perpendicular attaching connector 12a.

First and second shelf boards 13 and 14 are used horizontally. A plurality of vertical board receiving members 13a are attached onto the first shelf board 13 with a predetermined distance left therebetween. By means of the vertical board receiving member 13a, the first shelf board 13 slidably receives the vertical printed circuit boards 11. Similarly, a plurality of perpendicular board receiving members 14a are attached to the second shelf board 14. By means of the perpendicular board receiving member 14a, the second shelf board 14 slidably receives the perpendicular printed circuit boards 12.

Use is made of back and side boards 15 and 16, which may collectively be called a vertical back board. A plurality of vertical attaching connector 15a are rendered integral with the vertical back board 15 and a plurality of perpendicular receiving connectors 16a, with the side board 16.

The vertical receiving connectors 15a are for removably perpendicularly receiving the vertical attaching connectors 11a of the vertical printed boards 11. The perpendicular receiving connectors 16a are for removably vertically receiving the vertical attaching connectors 12a of the vertical printed boards 12.

On manufacturing the printed circuit board assembly, a technician either stands or sits in front of the vertical back board 15 and first places the shelf boards 13 and 14 in predetermined positions relative to the back board 15. Next, the technician assembles either the vertical or the perpendicular printed circuit boards 11 or 12 to the shelf boards 13 and 14 and to the back and the side boards 15 and 16 by using the vertical attaching and receiving connectors 11a and 15a and the perpendicular attaching and receiving connectors 12a and 16a. It will be presumed that the vertical printed circuit boards 11 are first attached to the first shelf board 13. In this event, the technician can make the vertical board receiving members 13a receive the vertical printed circuit boards 11 and use the vertical attaching and receiving connectors 11a and 15a while continuing to stand or sit without moving aside. Subsequently, the technician places the perpendicular printed circuit boards 12 on the second shelf board 14 by using the perpendicular attaching and receiving connectors 12a and 16a. On so assembling the perpendicular printed circuit boards 12, the technician must move aside the back board 15.

Figure 2:
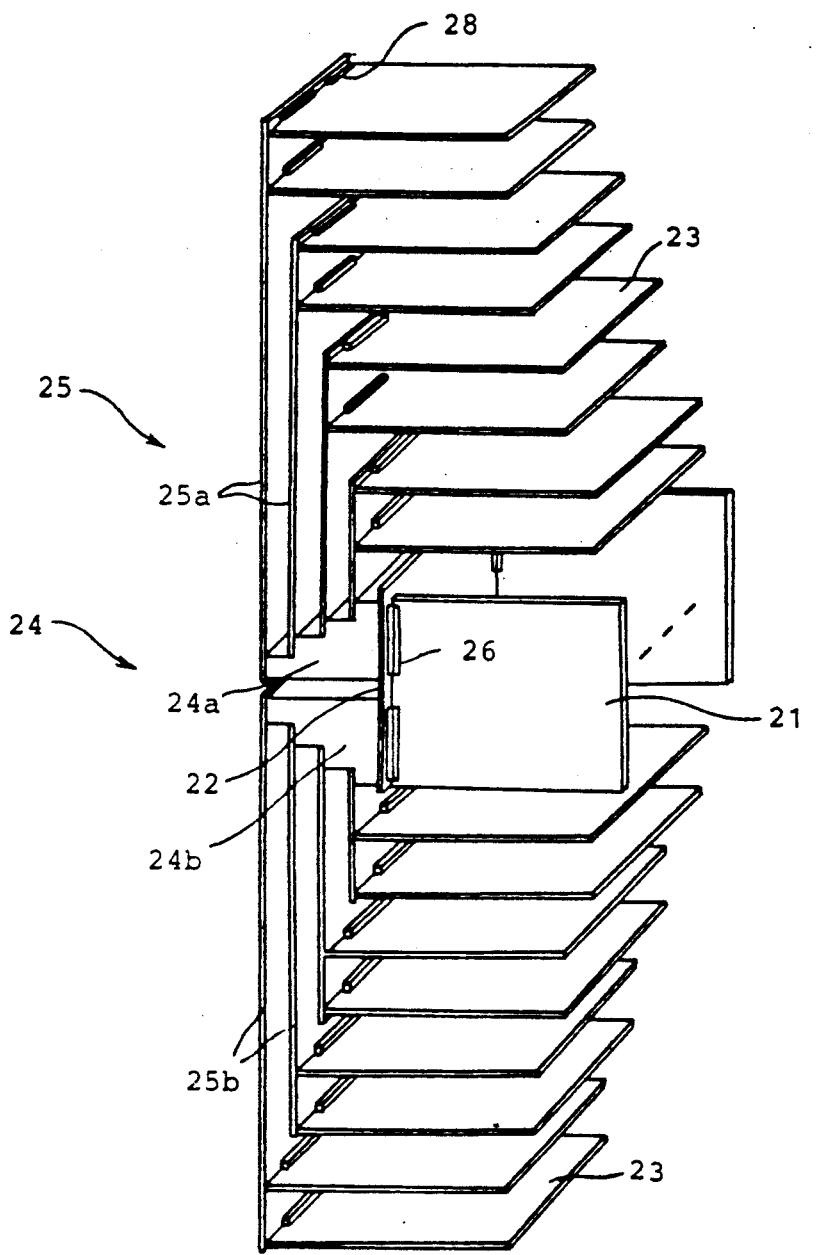
FIG. 2 is a perspective view of a printed circuit board assembly according to an embodiment of the present invention.

Referring now to FIG. 2, attention will be directed to a printed circuit board assembly according to a preferred embodiment of this invention. The printed circuit board assembly comprises a plurality of vertical printed circuit boards 21 which correspond to the vertical printed circuit boards 11 described in conjunction with FIG. 1. Each vertical printed circuit board 21 comprises at least one vertical attaching connector 26. It should be noted that two vertical attaching connectors 26 are depicted at each vertical printed board 21.

A plurality of perpendicular printed circuit boards 23 are disposed perpendicularly of the vertical printed circuit boards 21. In marked contrast to the perpendicular printed circuit boards 12 described in conjunction with FIG. 1, the perpendicular printed circuit boards 21 are disposed horizontally. Each perpendicular printed circuit board 23 comprises at least one perpendicular attaching connector 28. Like the vertical attaching connector 26, two perpendicular attaching connectors 28 are illustrated on each perpendicular printed circuit board 23.

A vertical back-board module 25 is used in the manner which will presently be described. The vertical back-board module 25 may be a printed circuit board unit for constituting a main part of the printed circuit board assembly being illustrated. The vertical back-board module 25 comprises upper and lower vertical back-board modules or vertical component back boards 25a and 25b. The upper and the lower vertical back-board modules 25a and 25b are connected to each other as will shortly become clear.

A connector group 24 is interposed between the upper and the lower vertical back-board modules 25a and 25b. In the manner which will presently be described, the connector group 24 comprises stepwise connectors 24a and 24b. The stepwise connectors 24a are electronic parts for electrically connecting the vertical printed circuit boards 21 and the upper vertical back-board 25a to each other. Similarly, the stepwise connectors 24b are electronic parts for electrically connecting the vertical printed circuit boards 21 and the lower vertical back-board 25b to each other.

A vertical front board 22 has a front surface and a back surface parallel in front of the vertical back-board module 25. The connector group 24 are used in mechanically attaching the upper and the lower vertical back-board modules 25a and 25b to the back surface of the vertical front board 22.

Figure 3:
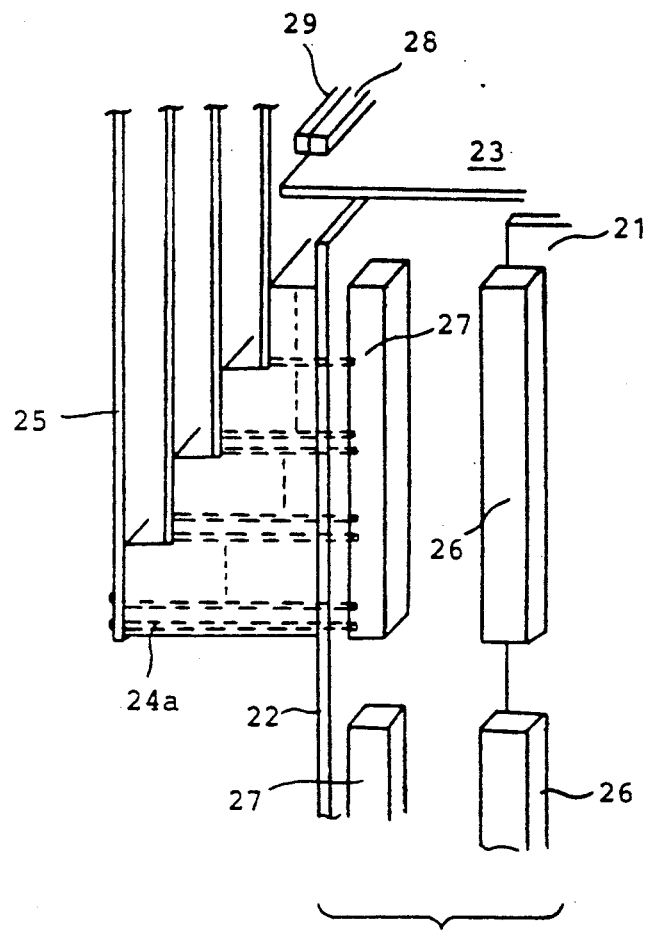
FIG. 3 is an enlarged perspective and partially exploded view of the printed circuit board assembly illustrated in FIG. 2.

Referring to FIG. 3 with FIG. 2 continuously referred to, a plurality of vertical receiving connectors 27 are attached to the front surface for removably vertically receiving the vertical attaching connectors 26 of the vertical printed circuit boards 21. A plurality of horizontal receiving connectors 29 are attached to the upper and the lower vertical back-board module 25a or 25b for removably horizontally receiving the perpendicular attaching connectors 28 of the perpendicular printed circuit boards 23.

Each of the upper and the lower vertical back-board module 25a and 25b comprises first, second, third, and fourth vertical component back boards which are successively stacked on one another parallel to the back surface of the vertical front board 22. The first through the fourth vertical component back boards have vertical lengths which stepwise increase as the vertical component back boards are distant from the back surface. The stepwise connectors include a plurality of pins 24a which the vertical component back boards and the vertical front board 22 are connected to. The pins 24a have stepwise increasing lengths to connect the back surface to the vertical component back boards.

The vertical component back boards have side edges, each pair of the edges on both sides of a common width. The side edges of the vertical component back boards are on common planes which are perpendicular to the back surface.

On manufacturing the printed circuit board circuit assembly, a technician or a worker stands or sits in front of the lower vertical back-board module 25b placed upright. The technician mounts the upper vertical back-board module 25a above the lower vertical back-board module 25b by using the connector group 24.

The technician places the vertical printed circuit boards 21 and the perpendicular printed circuit boards 23 in predetermined positions relative to the upper and the lower vertical back-board modules 25a and 25b. In this manner, the printed circuit board circuit assembly is assembled by using the vertical attaching and the receiving connectors 26 and 27 and the perpendicular attaching and the horizontal receiving connectors 28 and 29. The pins 24 may be soldered to terminals (not shown) of the vertical receiving connectors 27.

Similarly, the technician can disassemble the printed circuit board assembly which is once assembled. On disassembling the printed circuit board assembly, the technician can remove not only the vertical printed circuit boards 21 but also the perpendicular printed circuit boards 23 while the technician keeps standing or sitting in front of the printed circuit board assembly.

FIG. 2 will again be referred to with the top and the bottom placed at left-hand and right-hand sides. It will be understood that the vertical printed circuit boards 21 serve as perpendicular printed circuit boards and the perpendicular printed circuit boards 23, as vertical printed circuit boards. In the event being taking into consideration, the perpendicular boards 21 are disposed horizontally.

While this invention has thus far been described in specific conjunction with a few preferred embodiments thereof, it will now be readily possible for one skilled in the art to put this invention into practice in various other manners, for example, it is possible to assemble the printed circuit board assembly with the back-board module 25 placed at an angle relative to a vertical or a horizontal direction. The vertical attaching and the receiving connectors 26 and 27 may be exchanged. Similarly, the perpendicular attaching and the receiving connectors 28 and 29 may be exchanged.

What is claimed is:

1. A printed circuit board assembly comprising:
   a plurality of vertical printed circuit boards, each comprising a vertical attaching connector;
   a plurality of perpendicular printed circuit boards, each comprising a perpendicular attaching connector;
   a vertical back-board module;
   a vertical front board having a front surface and a back surface parallel in front of said vertical back-board module;
   a connector group attaching said vertical back-board module to said back surface;
   a plurality of vertical receiving connectors on said front surface for removably vertically receiving the vertical attaching connectors of said vertical printed circuit boards; and
   a plurality of horizontal receiving connectors on said vertical back-board module for removably horizontally receiving the perpendicular attaching connectors of said perpendicular printed boards.

2. A printed circuit board assembly as claimed in claim 1, wherein said perpendicular printed circuit boards are disposed horizontally.

3. A printed circuit board assembly as claimed in claim 2, wherein said vertical back-board module comprises:
   a plurality of vertical component back boards parallel to said back surface, said vertical component back boards having lengths which stepwise increase as each vertical component back board is distant from said back surface; and
   assembling means for assembling said vertical component back boards together into said vertical back-board module.

4. A printed circuit board assembly as claimed in claim 3, wherein said vertical component back boards have a common width.

5. A printed circuit board assembly as claimed in claim 4, said vertical component back boards having side edges: each pair of said edges on both sides of said common width, wherein the side edges of said vertical component back boards are on common planes which are perpendicular to said back surface.

6. A printed circuit board assembly comprising:
   a vertical front board having a front surface and a back surface;
   a vertical back-board module facing said back surface and comprising a plurality of vertical component back boards which are parallel to said back surface and which have stepwise varying lengths, said lengths forming at least a series of stepwise edgings; and
   a connector group comprising a plurality of stepwise connectors between said back surface and said stepwise edgings.

7. A printed circuit board assembly as claimed in claim 6, wherein said connector group comprises a plurality of connectors, each connector comprising a plurality of pins having stepwise increasing lengths to connect said back surface to said vertical component back boards.

8. A printed circuit board assembly comprising:
   a vertical front board having a front surface and a back surface;
   a vertical upper back-board module facing said back surface and comprising a plurality of upper vertical component front boards which are parallel to said back surface and which have stepwise varying upper lengths forming at least one series of stepwise upper edgings;
   an upper connector group comprising a plurality of upper stepwise connectors between said back surface and said upper stepwise edgings;
   a vertical lower back-board module facing said back surface and comprising a plurality of lower vertical component front boards which are parallel to said back surface and which have stepwise varying lower lengths forming at least one series of stepwise lower edgings; and
   a lower connector group comprising a plurality of lower stepwise connectors between said back surface and said lower stepwise edgings.

9. A printed circuit board assembly comprising:
   a plurality of perpendicular printed circuit boards, each comprising a perpendicular attaching connector;
   a plurality of vertical printed circuit boards, each comprising a vertical attaching connector;
   a vertical back-board module;
   a vertical front board having a front surface and a back surface parallel in front of said vertical back-board module;
   a connector group attaching said vertical back-board module to said back surface;
   a plurality of horizontal receiving connectors on said front surface for removably horizontally receiving the perpendicular attaching connectors of said perpendicular printed circuit boards; and
   a plurality of vertical receiving connectors on said vertical back-board module for removably vertically receiving the vertical attaching connectors of said vertical printed boards.

10. A printed circuit board assembly as claimed in claim 9, wherein said perpendicular printed circuit boards are disposed horizontally.

11. A printed circuit board assembly as claimed in claim 10, wherein said vertical back-board module comprises:
    a plurality of vertical component back boards parallel to said back surface, said vertical component back boards having lengths which stepwise increase as each vertical component back board is distant from said back surface; and
    assembling means for assembling said vertical component back boards together into said vertical back-board module.

12. A printed circuit board assembly as claimed in claim 11, wherein said vertical component back boards have a common width.

13. A printed circuit board assembly as claimed in claim 12, said vertical component back boards having side edges: each pair of said edges on both sides of said common width, wherein the side edges of said vertical component back boards are on common planes which are perpendicular to said back surface.

* * * * *